United States Patent [19]

Nowlin et al.

[11] 4,123,308

[45] Oct. 31, 1978

[54] PROCESS FOR CHEMICALLY BONDING A POLY-P-XYLYLENE TO A THERMOSETTING RESIN AND ARTICLE PRODUCED THEREBY

[75] Inventors: Thomas E. Nowlin, Somerset; Ronald A. Martineau, Irvington, both of N.J.

[73] Assignee: Union Carbide Corporation, New York, N.Y.

[21] Appl. No.: 843,653

[22] Filed: Oct. 19, 1977

[51] Int. Cl.$^2$ .................... C08F 8/00; C08F 2/46; B05D 3/06

[52] U.S. Cl. .................... 156/272; 156/306; 204/158 HE; 204/159.22; 204/168; 427/34; 427/42; 427/44; 427/140

[58] Field of Search ............... 427/34, 36–42, 427/44, 54, 140; 156/272, 306; 204/158 HE, 159.13, 159.19, 159.21, 159.22, 165, 168

[56] References Cited

U.S. PATENT DOCUMENTS

| 2,309,299 | 3/1967 | Mantell | 204/165 |
| 2,956,899 | 10/1960 | Cline | 427/36 |
| 3,318,790 | 5/1967 | Carbajal et al. | 204/165 X |
| 3,378,391 | 4/1968 | Winzeler et al. | 427/34 |
| 3,415,986 | 12/1968 | Shepard | 250/49.5 |
| 3,677,877 | 7/1972 | Metevia et al. | 428/409 |
| 3,870,610 | 3/1975 | Baird et al. | 204/165 |
| 3,901,994 | 8/1975 | Mehalso et al. | 427/39 X |
| 3,914,521 | 10/1975 | Beatty et al. | 204/168 X |
| 4,029,876 | 6/1977 | Beatty et al. | 204/165 X |

OTHER PUBLICATIONS

Pergamon Press (1960), vol. II, pp. 753–759, Holland, "Effects of Glow Discharge etc."

*Primary Examiner*—Harold Ansher
*Attorney, Agent, or Firm*—Saul R. Bresch

[57] ABSTRACT

Poly-p-xylylene is chemically bonded to a thermoset resin via a reaction between oxygen-containing groups at the surface of the poly-p-xylylene and a reactant component of the thermosetting resin. A low temperature plasma is employed to chemically modify the surface of the poly-p-xylylene to incorporate the oxygen atoms into the backbone of the polymer at its surface.

19 Claims, No Drawings

PROCESS FOR CHEMICALLY BONDING A POLY-P-XYLYLENE TO A THERMOSETTING RESIN AND ARTICLE PRODUCED THEREBY

BACKGROUND OF THE INVENTION

1. Field of the Invention

This invention relates in general to a process for chemically bonding vapor deposited poly-p-xylylene to a thermoset resin and the article produced thereby. In one aspect, this invention relates to a process for chemically bonding poly-p-xylylenes to thermoset resins by pre-treatment of the poly-p-xylylenes with a low temperature plasma. In a further aspect, this invention is directed to poly-p-xylylenes coated with a thermoset resin wherein the bond between the two is chemical and superior to those currently available.

2. Description of the Prior Art

Vapor deposited para-xylylene polymers (parylenes) are commonly empoloyed to coat or encapsulate various types of substrates since they are insoluble in every common organic solvent at room temperature, are touch resistant, moisture resistant and exhibit low permeability to most gases and vapors. These polymers have been found to remain tough and flexible for a long period of time over a wide temperature range, thus permitting their use in conformally coating electronic assemblies such as printed circuit (PC) boards.

In some applications, it is sometimes necessary to repair or rework parylene coated electronic assemblies. This involves removing the parylene coating around a defective component and replacing the component. Then, a patching compound, typically a thermosetting resin, is applied around the new replacement component to protect it. The patching compound must adhere to the replacement component (the repaired region) and the unremoved parylene coating around the perimeter of this region. An important problem encountered in the commercial application of thermosetting resins has been the difficulty in their adhesion to the parylene surface to be coated. Attempts to improve adhesion between the thermoset resin and the unremoved parylene coating around the perimeter of the repaired region have involved mechanical roughening of the parylene with sandpaper or solvent swelling of the surface of the parylene.

It is well known that polymer films may be surface treated to improve adhesion and wettability through methods such as chemical treatment, flame exposure, beta-particle or gamma-ray bombardment, electrical corona exposure, glow discharge exposure or cold plasma exposure. The cold plasma approach has several advantages over the other methods: There is flexibility in choosing the interacting medium. A high degree of control over the conditions of the system can be exercised. And the treatment time is relatively short. Furthermore, the cold plasma treatment has a higher degree of safety than other techniques since chemical treatment usually involves strong acids or bases, flame treatment presents a heat problem, high energy radiation requires heavy shielding around the work area, and electrical corona requires electrode potential of several kilovolts. Most of these problems are absent with cold or low temperature plasmas, i.e., voltages are low, the radiation is negligible, and at the low operating pressure involving heat is not a major factor. In addition, the use of strong, corrosive chemicals is avoided.

However, prior art treatments of polymeric films by electrical discharge relied on chemical reactions or coatings on the surface which have a tendency to show up not only on the film surface but within the surface. In some instances, "treat-through" occurs so that a relatively thin film will be treated completely through its thickness and on both surfaces.

By "cold plasma" as used throughout this application is meant a discharge having a high electron temperature and a low gas temperature, a nonequilibrium system. The nonequilibrium condition can be explained by considering the mode of excitation. For example, when high frequency alternating current imposes polarity reversals upon the plasma particles in the order of several million times per second, the particles are alternately accelerated thereby greatly increasing the probability of particle collision. The collisions are sufficiently strong to ionize and disassociate the gas molecules and thereby produce a plasma which comprises chemically active ions, radical species and free electrons.

In a cold or low temperature plasma the pressure must be low, of the order of less than 100 torr, making possible a relatively large mean free path for the electrons produced by the excitation. As used herein, the unit "torr" is equivalent to one millimeter of mercury (1 mm Hg). Since electrons are lighter and far more mobile than the considerably heavier gas ions, energy is more readily and selectively imparted to the electrons. Thus, in a cold plasma, the gas temperature will be of the order of several hundred degrees kelvin while the electron energy will correspond to a temperature of several thousand degrees kelvin. Since this represents a low energy density when compared to "hot" plasmas such as those produced in an electric arc, the term "cold plasma" is applied. Another synonymous term is "glow discharge." The cold plasmas herein are generated at radiofrequencies just beyond audible frequencies and range from 15 thousand Hertz (Hz) per second up to and beyond 30 Megahertz (MHz) per second.

SUMMARY OF THE INVENTION

Accordingly, one or more of the following objects will be achieved by the practice of this invention. It is an object of this invention to provide a process for chemically bonding vapor deposited polymers such as poly-p-xylylenes to thermoset resins. Another object of this invention is to provide a process for treating poly-p-xylylene polymers with a cold plasma to chemically modify their surfaces. Still another object of this invention is to provide an improved method of repairing an electronic assembly coated with poly-p-xylylene film wherein the possibility of accidentally electronically altering the electronic assembly is minimized. An object of this invention is to provide a composite material comprised of poly-p-xylylene chemically bonded to a thermoset resin. Another object is to provide a chemical bond between poly-p-xylylene and a thermoset resin which is stronger than the poly-p-xylylene material itself. Still another object is to provide a chemically modified poly-p-xylylene whose surface energy is greater than 55 dynes/cm. An object of this invention is to provide a repaired electronic assembly coated with poly-p-xylylene film and a thermoset resin capable of performing as well as the original assembly (before repair). These and other objects will readily become apparent to those skilled in the art in the light of the teachings hereinafter set forth.

It has now been found that a relatively simple and effective process is provided for chemically bonding a thermoset resin to a poly-p-xylylene substrate by exposing the poly-p-xylylene to a cold plasma in a confined region for a period of time sufficient to chemically modify the surface of the poly-p-xylylene exposed to the cold plasma, depositing an uncured liquid thermosetting resin over the chemically modified poly-p-xylylene surface; and then heating the thermosetting resin and poly-p-xylylene at a temperature and time sufficient to both cure the thermosetting resin into a solid thermoset resin and chemically bond the chemically modified surface of the poly-p-xylylene to the thermoset resin in situ.

DESCRIPTION OF THE PREFERRED EMBODIMENT

The basic process of the present invention may be more explicitly defined as a process for chemically bonding a thermoset resin to a poly-p-xylylene substrate comprising: providing a cold plasma within a confined region evacuated to a pressure lower than about 100 torr; exposing at least one surface of the poly-p-xylylene substrate directly to said plasma within said region for a period of time sufficient to incorporate oxygen-containing functional groups thereinto which contain active hydrogen atoms; depositing an uncured liquid thermosetting resin capable of chemically reacting with active hydrogen atoms over the plasma treated poly-p-xylylene surface; and heating the thermosetting resin and poly-p-xylylene at a temperature at which the thermosetting resin cures into a solid thermoset resin for a time period sufficient to both cure the thermosetting resin into a solid thermoset resin and chemically bond the plasma treated surface of the poly-p-xylylene to the cured thermoset resin in situ via the oxygen-containing functionsl groups at the surface of the poly-p-xylylene substrate.

The basic product of the present invention may be more explicitly defined as a composite material comprised of poly-p-xylylene chemically bonded to a thermoset resin.

The preferred poly-p-xylylenes for use in this invention are linear poly-p-xylylenes, and the subsequent description of the present invention will be based on the use of such polymers.

General Preparation of Para-Xylylene Polymers

Linear para-xylylene polymers are usually prepared by condensing, in a condensation zone, vapors of p-xylylene monomers which can be produced by the pyrolytic cleavage, in a pyrolysis zone, of one or more cyclic dimers represented by the following structure:

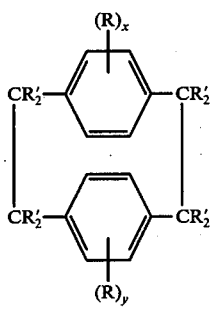

wherein R is an aromatic nuclear substituent, $x$ and $y$ are each integers from 0 to 3, inclusive, and R' is H, Cl and/or F. The thus formed vaporous p-xylylene moiety may be in the form of diradicals having the structures

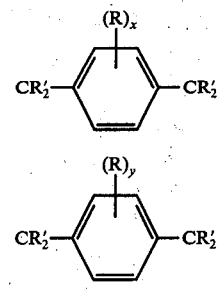

and and/or moieties having the tetraene or quinoid structures:

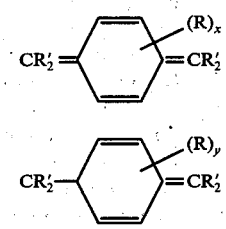

and

It is believed that the tetraene or quinoid structure is the dominant structure which results when the dimer is pyrolyzed, but that the monomer polymerizes as though it were in the diradical form.

Thus, where $x$ and $y$ are the same, and the aromatic nuclear substituent on each monomer is the same, and all the R's are the same, two moles of the same p-xylylene monomer are formed, and when condensed, yield a substituted or unsubstituted p-xylylene hompolymer. When $x$ and $y$ are different or the aromatic nuclear substituents on each p-xylylene monomer are different, or the R's are different, condensation of such monomers will yield copolymers as hereinafter set forth. Examples of the R substituent groups which may be present in the dimers and monomers are organic groups such as alkyl, aryl, alkenyl, cyano, alkoxy, hydroxy alkyl, carboxyl, carboxyalkyl and like radicals and inorganic radicals such as hydroxyl, halogen and amino groups. COOH, $NO_2$ and $SO_3H$ groups may be added as R groups to the polymer after it is formed. The unsubstituted positions on the aromatic rings are occupied by hydrogen atoms.

The particularly preferred substituent R groups are the $C_1$ to $C_{10}$ hydrocarbon groups, such as the lower alkyls, i.e., methyl, ethyl, propyl, butyl and hexyl, and aryl hydrocarbons such as phenyl, alkylated phenyl, naphthyl and like groups; and the halogen groups, chlorine, bromine, iodine and fluorine. Hereinafter the term "a di-p-xylylene" refers to any substituted or unsubstituted cyclic di-p-xylylene as hereinabove discussed.

Condensation of the p-xylylene monomers to form the p-xylylene polymers can be accomplished at any temperature below the decomposition temperature of the polymer, i.e., at < 250° C. The condensation of the monomers will proceed at a faster rate, the colder the substrate is on which the condensation is to take place. Above certain temperatures, which might be defined as a ceiling condensation temperature, the monomers will condense at rates which are relatively slow for commercial applications. Each has a different ceiling condensation temperature. For example, at 0.5 mm Hg pressure the following condensation and polymerization ceilings are observed for the following monomers:

|                  | Degrees centigrade |
|------------------|--------------------|
| p-Xylylene       | 25–30              |
| Chloro-p-xylylene| 70–80              |
| Cyano-p-xylylene | 120–130            |
| n-Butyl-p-xylylene | 130–140          |
| Iodo-p-xylylene  | 180–200            |

Thus, homopolymers may be made by maintaining the substrate surface at a temperature below the ceiling condensation temperature of the particular monomer species involved, or desired in the homopolymer. This is most appropriately termed "homopolymerizing conditions."

Where several different monomers existing in the pyrolyzed mixture have different vapor pressure and condensation characteristics as for example p-xylylene, or any other mixture thereof with other substituted p-xylylenes, homopolymerization will result when the condensation and polymerization temperature is selected to be at or below that temperature at which only one of the monomers condenses and polymerizes. Thus, for the purpose of this invention the term "under homopolymerization conditions" is intended to include those conditions where only homopolymers are formed.

Therefore it is possible to make homopolymers from a mixture containing one or more of the substituted monomers when any other monomers present have different condensation or vapor pressure characteristics, and wherein only one monomer species is condensed an polymerized on the substrate surface. Of course, other monomer species not condensed on the substrate surface can be drawn through the apparatus as hereinafter described in vaporous form to be condensed and polymerized in a subsequent cold trap.

Inasmuch as the p-xylylene monomers, for example, are condensed at temperatures of about 25° to 30° C., which is much lower than that at which the cyano p-xylylene monomers condense, i.e., about 120° to 130° C., it is possible to have such p-xylylene monomers present in the vaporous pyrolyzed mixture along with the cyano-substituted p-xylylene monomers when a homopolymer of the substituted dimer is desired. In such a case, homopolymerizating conditions for the cyano p-xylylene monomers are secured by maintaining the substrate surface at a temperature below the ceiling condensation temperature of the substituted p-xylylene but above that of the unsubstituted p-xylylene; thus permitting the unsubstituted p-xylylene vapors to pass through the apparatus without condensing and polymerizing, but collecting the poly p-xylylene in a subsequent cold trap.

It is also possible to obtain substituted copolymers through the pyrolysis process hereinabove described. Copolymers of p-xylylene and substituted p-xylylene monomers, as well as copolymers of substituted p-xylylene monomers wherein the substituted groups are all the same radicals but wherein each monomer contains a different number of substituent groups, can all be obtained through such pyrolysis process.

Copolymerization also occurs simultaneously with condensation, upon cooling of the vaporous mixture of reactive monomers to a temperature below about 200° C. under polymerization conditions.

Copolymers can be made by maintaining the substrate surface at a temperature below the ceiling condensation temperature of the lowest boiling monomer desired in the copolymer, such as at room temperature or below. This is considered "copolymerizing conditions," since at least two of the monomers will condense and copolymerize in a random copolymer at such temperature.

In the pyrolytic process, the reactive monomers are prepared by pyrolyzing a substituted and/or unsubstituted di-para-xylylene at a temperature less than about 750° C., and preferably at a temperature between about 600° C. to about 680° C. At such temperatures, essentially quantitative yields of the reactive monomers are secured. Pyrolysis of the starting di-p-xylylene begins at about 450° C. regardless of the pressure employed. Operation in the range of 450°–550° C. serves only to increase the time of reaction and lessen the yield of polymer secured. At temperatures above about 750° C., cleavage of the substituent group can occur, resulting in a tri-or polyfunctional species causing cross-linking or highly branched polymers.

The pyrolysis temperature is essentially independent of the operating pressure. It is preferred, however that reduced or subatmospheric pressures be employed. For most operations, pressures within the range of 0.0001 to 10 mm Hg absolute are most practical. However, if desired, greater pressures can be employed. Likewise, if desirable, inert vaporous diluents such as nitrogen, argon, carbon dioxide, steam and the like can be employed to vary the optimum temperature of operation or to change the total effective pressure in the system.

When the vapors condense on the substrate to form the polymer, i.e., coating, the coating forms as a continuous film of uniform thickness. The coatings are transparent and pinhole free. The thickness of the coating can be varied by various procedures, as by varying the amount of dimer used, and by varying the reaction temperature, time, pressure, and substrate temperature.

Thermosetting resins suitable for use in this invention are any thermosetting resins capable of reacting with active hydrogen atoms such as hydroxyl groups to form a C—O—C bond therewith; one of the carbon atoms in the bond may be carbonyl. Illustrative of these well known thermosetting resins are methyl and methyl phenyl silicone resins having a combined organo to Si ratio of 0.5 to 1.8; alkyd resins (oil and non-oil modified), for example, a coreaction product of a drying oil such as linseed oil and tung oil, phthalic anyhydride, ethylene glycol and glycerine in appropriate stoichiometric proportions (the catalyst being a cobalt or lead salt); phenolic resins; melamine formaldehyde resins; urea formaldehyde resins; bisphenol-A-formaldehyde resins; epoxy resins, polyurethane resins and the like. Particularly preferred in the practice of this invention are the polyurethane resins including any of the five classifications thereof established and currently defined by the American Society for Testing and Materials (ASTM) as follows:

Type 1: One component prereacted. These are the urethane-oil or uralkyd types in which polyisocyanates have been reacted with a polyhydric alcohol ester of a vegetable fatty acid. They cure by oxidation at ambient or slightly higher temperature in 5 min. to 1 hr.

Type 2: One-component moisture-cured. These are resins having free reactive isocyanate groups which can cross-link and harden with ambient moisture. They are slower curing than Type 1, requiring 1 to 12 hr.

Type 3: One-component heat-cured. These are the latent phenol-blocked isocyanates which at elevated temperatures will release the blocking agent and regenerate the active isocyanate.

Type 4: Two-component catalyst-cured. These systems consist of a prepolymer or adduct having free isocyanate groups as one component and a catalyst as a second component. Small amounts of the catalyst will cross-link the prepolymer. Catalysts may consist of monomeric polyols or polyamines. The pot life after the two components are mixed is generally quite short and varies inversely with the amount of catalyst used.

Type 5: Two-component polyol-cured. In this classification, one component is a prepolymer or adduct having free isocyanate groups, and the other is resin having reactive hydrogen atoms such as hydroxyl-terminated polyesters or polyols such as castor oil.

The thermosetting resins employed in this invention and the reaction mechanism involved in their cure are well known in the art.

The bond between the poly-p-xylylene surface and the resinous material is a chemical bond. This bond is formed during the curing cycle of the thermosetting material, i.e., when it forms a solid resin. While the reaction mechanism that controls the bonding of the poly-p-xylylene to the thermosetting resin is not fully understood, it is believed that oxygen-containing functional groups, for example, hydroxyl groups, situated in the vicinity of or at the surface of the poly-p-xylylene are involved in the curing mechanism. These oxygen-containing functional groups are incorporated into the poly-p-xylylene surface during plasma treatment thereof as more fully described subsequently herein.

In each of the thermosetting formulations previously mentioned herein, one of the components involved in the reaction mechanism forming the respective resin contains an active hydrogen atom such as organic alcohol. The active hydrogen atom reacts with a "second component" during curing of the resin. When the resin is cured in the presence of the oxygen-containing functional groups at the surface of the poly-p-xylylene, it is believed that they enter into the reaction mechanism of the resin and react with the "second component" during curing of the resin thereby chemically bonding the poly-p-xylylene to the thermoset resin. For example, in the reaction mechanism of a two component polyol-cured polyurethane resin, one component having reactive hydrogen atoms such as polyols reacts with a "second component" having free isocyanate groups. When this two component polyol-cured polyurethane resin is cured in the presence of the oxygen-containing functional groups at the surface of the poly-p-xylylene, the free isocyanate groups can react with either the reactive first component in the polyurethane or with an active hydrogen atom such as an organic alcohol or organic acid (hydroxyl group or carboxyl group) at the surface of the oxidized poly-p-xylene. Reaction of the free isocyanate groups of the resin with active hydrogen atoms at the surface of the poly-p-xylylene chemically bonds the resin to the poly-p-xylylene.

The strength of the chemical bond at the resin-parylene interface is proportional to the extent to which oxygen-containing groups at the surface of the parylene enter into the reaction involved in curing the thermoset. It has been found that the chemical bond produced according to this invention is at least about seven times stronger than the bond achieved heretofore, i.e., between an untreated parylene and thermoset. In a preferred embodiment of this invention wherein an argon or helium plasma is employed at controlled conditions to treat the surface of a parylene, the strength of the chemical bond between the parylene and thermoset is at least twelve times stronger than achieved heretofore and indeed the chemical bond is actually stronger than the parylene itself.

Techniques for applying a low pressure, low-temperature cold plasma or glow discharge are well known in the art. One type of glow discharge apparatus uses an RF induction coil to generate the plasma that surrounds the substrate to be treated. The vacuum pump establishes a low background pressure before any gas is admitted into the work chamber. Once started, the gas flows continuously from the supply via flow regulating controls. At the correct pressure level, RF power from the generator, tuned into the plasma load by the matching transformer network, transfers about 300 W per run from the 50 ohm generator output to the several thousands of ohms of impedance that the plasma load may represent.

A second type of glow discharge apparatus uses a pair of capacitor plates to generate the plasma for treating substrates. In addition, this apparatus contains a perforated aluminum cylinder that prevents ultraviolet radiation and charged particles, other than fluorine, from penetrating the space within the cylinder. The second type of glow discharge apparatus described hereinabove is preferred for use in the present invention.

The following is a description of an apparatus embodiment suitable for the practice of this invention: the apparatus may consist of an aluminum chamber 4.5 inches (height) by 7 inches (width) by 7 inches (depth) evacuated to a low vacuum, preferably less than about 1 torr. A gas flow may be introduced at approximately 150 cc/min; the pressure within the chamber is now about 2-3 torr. The RF power supply operates at 13.56 MHz. A variable power supply from 0-300 watts may be activated and the plasma is formed. While the pressure at which the plasma is generated may be less than about 100 torr, it is preferred to operate at a pressure between about 1 and about 4 torr, and most preferred is a pressure of between about 1 and about 3 torr.

Gases suitable for the cold plasma include oxygen-containing gases such as air, carbon monoxide, carbon dioxide, oxygen, sulfur dioxide, and the nitrogen oxides as well as inert gases such as nitrogen, argon, helium and the like. The preferred gases for use in the creation of the plasma are argon and helium.

When oxygen or air is used as the gas to form the cold plasma, the parylene exposed to the plasma is very rapidly oxidized. About 1000Å of parylene is typically etched per minute. The oxidized parylene surface contains oxygen functionality such as carbonyl and hydroxyl groups. However, when an argon or helium plasma is employed, residual oxygen and nitrogen in the chamber also react with the parylene surface, but at a much slower rate to provide the oxygen functionality previously mentioned. It is to be noted, however, that when an argon or helium plasma is employed, the parylene surface is not etched at any substantial rate. Consequently, the change in surface modification of the parylene becomes dependent on the length of time it is exposed to the plasma.

The controlled surface oxidation by means of a cold plasma according to this invention provides a chemically modified parylene surface characterized by having a surface energy greater than about 55 dynes/cm, preferably between about 55 dynes/cm and about 90 dynes/cm and most preferably between about 75 dynes/cm and about 90 dynes/cm. The bulk of the oxygen incorporated into the parylene is found at the surface exposed to the plasma, i.e., less than about 1500Å below the surface of the parylene exposed to the plasma. There is no substantial bulk oxidation of the entire parylene. Indeed, there is only about ten percent change in the oxygen content of the parylene after plasma treatment thereof according to this invention.

The following examples illustrate at least one of the best modes for presently conducting the process of this invention and of the articles produced thereby.

EXAMPLE 1

Epoxy-fiberglass curcuit board material 4cmX4cm were coated with 0.7 mils of poly (monochloro)-p-xylylene. The coated substrates were then treated with cold plasmas for up to 6 minutes. A TEGAL plasmaline Model 211 (commercially available from Tegal Corporation, 860 Wharf Street, Richmond, Calif. 94804) was employed to provide the cold plasmas used. The R.F. power supply operated at 13.56MHz with an input power operated at 100 watts. The aluminum chamber was 4.5 in height × 7 in width × 7 inches in depth. Cylinder grade oxygen, argon and helium were used in this example with a flow rate of about 150cc/min and a chamber pressure of about 1 torr.

Then coated substrates were treated with each gas at 100 watts for one minute in runs 2, 4 and 6 (reported in Table I below) and for 6 minutes in runs 3, 5 and 7 (reported in Table I below. Consequently, the results reported for each run are actually the average of 10 separate tests conducted on ten separate samples employing the conditions specified for each run. About 0.2 ml of an uncured polyurethan resin patching material, CONAP CE-1155 (commercially available from CONAP. Inc., 1405 Buffalo Street, Olean, N.Y. 14760), was applied immediately to the cold plasma treated poly (monochloro)-p-xylylene surface in each run. A five pound stainless steel rivet with a head surface area of 0.122 square inches was sanded, cleaned, vapor degreased in trichloroethylene, dried and then pressed by hand onto the uncured polyurethane liquid. The test samples for runs 2-7 were cured (according to the manufacturer's specifications for Conap CE-1155 and the adhesion of the rivet to the substrate was measured by pulling on the rivet using a Table Model Instron (commercially available from Instron, Inc., 2505 Washington Street, Canton, Massachusetts 02021). This test procedure is referred to as the "rivet-pull test." This instrument is commonly used in the coating and adhesive industry to measure the force required to pull apart two materials bonded to one another. A pull rate of 0.2 inch/min was employed. The results of these experiments are summarized in runs 1-7 in Table I hereinbelow:

TABLE I

Adhesion of a Cured Polyurethane Thermoset Resin to a Poly (Monochloro)-P-Xylylene Surface

| | Plasma (time of Treatment, minutes) | Adhesion (lbs/inch$^2$) |
|---|---|---|
| Run 1 | none (0)* | 26 ± 6 |
| Run 2 | oxygen (1) | 180 ± 30 |
| Run 3 | oxygen (6) | 200 ± 45 |
| Run 4 | argon (1) | 220 ± 25 |
| Run 5 | argon (6) | 390 ± 120 |
| Run 6 | helium (1) | 190 ± 50 |

TABLE I-continued

Adhesion of a Cured Polyurethane Thermoset Resin to a Poly (Monochloro)-P-Xylylene Surface

| | Plasma (time of Treatment, minutes) | Adhesion (lbs/inch$^2$) |
|---|---|---|
| Run 7 | helium (6) | 355 ± 55 |

*Control samples received no plasma pretreatment

Examination of the results summarized in Table I indicates that the adhesion of the cured polyurethane thermoset resin to all plasma treated samples (Runs 2–7) is at least about seven times better than the adhesion measured with samples that were not plasma treated (run 1). In addition, the adhesion measured for samples which were oxygen plasma treated for one minute (run 2) and six minutes (run 3) are approximately the same, 180–200 lbs/inch$^2$.

However, the adhesion measured for samples which were treated with argon or helium for six minutes (runs 5 and 7) is much better than for samples treated with argon or helium for one minute (run 4 and run 6). Moreover, the adhesion measured for samples which were treated for 6 minutes with argon or helium plasmas (run 5 and run 7) is much better than for samples treated with an oxygen plasma for 1 minute (run 2) or for 6 minutes (run 3).

EXAMPLE 2

The test samples employed for runs 1–3, 5 and 7 of Example 1 were subjected to temperature and humidity cycling according to U.S. MIlitary Specification MIL-I-46058C (available from the Department of the Army, Headquarters U.S. Army Electronics Command, Fort Monmouth, New Jersey 07703). An average of 5 test samples was employed to arrive at the results reported for each run in this experiment. The samples were subjected to 10 24-hour temperature cycles at 90% relative humidity. The purpose of this test was to determine whether moisture influenced the original bond strengths reported in Example 1 hereinabove. A chemical bond in the samples would not be broken by exposure to moisture under such conditions. The test results are summarized in Table II hereinbelow:

TABLE II

Adhesion of a Cured Polyurethane Thermoset Resin to a Poly (monochloro)-P-Xylylene Surface After Temperature - Humidity Cycling

| | Plasma time of treatment (minutes) | Adhesion (lb/in$^2$ After Temperature-Humidity Cycling |
|---|---|---|
| Run 1 | None (0)* | 40 ± 6 |
| Run 2 | Oxygen (1) | 220 ± 30 |
| Run 3 | Oxygen (6) | 230 ± 25 |
| Run 5 | Argon (6) | 420 ± 150 |
| Run 7 | Helium (6) | 430 ± 90 |

*Control samples received no plasma treatment

As can be seen from a comparison between the adhesion values found in Tables I and II, the values did not substantially change after the temperature-humidity cycling which indicates the presence of a chemical bond between the polyurethane resin and the plasma treated poly (monochloro)-p-xylylene. Note that in run 1, the control test, the initial bond before exposure to temperature-humidity cycling tests, was so poor that the test did not substantially reduce its value further.

EXAMPLE 3

Using the procedure described in Example 1, four runs were made using air, oxygen, argon and helium plasmas, respectively, at 100 watts for 6 minutes. The results of six test samples for each run were averaged. In one case, the polyurethane thermosetting resin was applied to the plasma treated poly-p-xylene surface immediately after the samples were removed from the plasma chamber (after exposure to the plasma). In a second case, the polyurethane thermosetting resin was applied to the plasma treated poly-p-xylene surface one week after the samples hadbeen removed from the plasma chamber. The "rivet-pull test" was used to measure adhesion between the polyurethane thermoset and the plasma-treated poly-p-xylene surface. The results of these tests are summarized in Table III hereinbelow:

TABLE III

The Adhesion of a Polyurethane Thermoset to Plasma Treated Poly (Monochloro)-P-Xylylene Surface

| | | Adhesion (lbs/in$^2$) | |
|---|---|---|---|
| | Plasma Gas | Immediately After Plasma Treatment | One week after Plasma Treatment |
| Run 1 | air | 233 ± 25 | 322 ± 24 |
| Run 2 | oxygen | 178 ± 35 | 268 ± 19 |
| Run 3 | argon | 319 ± 6 | 365 ± 54 |
| Run 4 | helium | 353 ± 37 | 408 ± 52 |

As can be seen from the results summarized in Table III above, the adhesion of the polyurethane thermoset resin to the surface of the poly (monochloro)-p-xylene is not substantially affected by a lapse of time between the termination of plasma treatment of the parylene and the subsequent application thereto of the polyurethane thermosetting resin. Based upon these results, it is believed that the chemical modification of the parylene surface produced by plasma treatment thereof is not a temporary phenomenon.

EXAMPLE 4

Free standing films (6 cm × 7 cm and approximately 0.7 mils thick) of poly (monochloro)-p-xylene (parylene C) and poly-para-xylene (parylene N) were treated with an oxygen plasma at 20 watts and 100 watts of power for 10 minutes. The oxygen plasma was generated as described in Example 1. These treated films were compared with untreated films to determine whether any bulk oxidation of the poly-p-xylenes occurred during the oxygen plasma treatment.

The samples were analyzed for oxygen by a neutron activation technique (performed at the Union Carbide Nuclear Service Division, Sterling Forest Laboratories, Tuxedo, N.Y. 10987). The results of these analyses are reported in Table IV hereinbelow:

TABLE IV

| Neutron Activation Oxygen Analyses | | |
|---|---|---|
| Sample | Treatment | PPM Oxygen* |
| Run 1 | parylene C | None | 990 |
| Run 2 | parylene C | 20 watts | 800 |
| Run 3 | parylene C | 100 watts | 800 |
| Run 4 | parylene N | None | 1090 |
| Run 5 | parylene N | 20 watts | 1360 |
| Run 6 | parylene N | 100 watts | 1120 |

*Average of at least two separate determinations, values ± 200 ppm

The results indicate that the oxygen content of these films is essentially unaffected by the oxygen plasma. Consequently, the plasma oxidation must be a surface effect and little, if any, oxidation in the bulk of the sample occurs.

EXAMPLE 5

In order to demonstrate that a chemical modification of the poly-p-xylene surface takes place as a result of cold plasma treatment, infrared attenuated total reflectance (ATR) spectroscopy and water contact angle measurements were performed.

Parylene C and N films were plasma treated as described previously in Example 4. Examination of the ATR spectra of plasma treated and untreated samples indicated the chemical incorporation of oxygen into the plasma treated parylene C and N film surfaces.

The following procedure was used to measure the water contact angle of plasma treated and untreated parylene C and N films: A 4 microliter drop of distilled water was carefully placed on the flat, horizontal surface of the parylene film with a microsyringe. The drop and surface were then photographed from the side of the drop at a 90° angle thereto. The measured water contact angle was 90° for all untreated parylene films used in this example. This contact angle is equivalent to a surface energy of 45 dynes/cm.

80 samples each of parylene C and N films were treated with helium, argon, oxygen or nitrogen plasmas as described previously herein in Example 1 at plasma exposure times from 1 to 10 minutes. The following results were obtained: The water contact angle measured for the plasma treated samples was always smaller than 40° measured 0.3 hours after plasma treatment. The water contact angle increased with the time lapse after the plasma treatment. But it usually stabilized after 24 hours and never returned to a value greater than 60°.

Moreover, with parylene N films, helium and argon plasmas were found to produce the smallest water contact angles and correspondingly, the largest surface energies, greater than 75 dynes/cm. With helium and argon plasmas, the contact angle was measured 0.3 hours after removal of the parylene C and N films from the plasma chamber. The contact angle produced depended on the power level utilized during the plasma exposure and the length of time of the plasma exposure. The higher powers (100 watts vs. 20 watts) and longer plasma exposure times (6 minutes vs. 1 minute) yielded smaller water contact angles. This was not found to be the case when oxygen plasmas were employed. In the case of an oxygen plasma treatment the changes in measured water contact angles as a function of power or exposure time were not substantial. The change in water contact angles indicated a chemical modification of the surface of the parylene C and N films due to their exposure to a cold plasma.

Although the invention has been illustrated by the preceding examples, it is not to be construed as being limited thereto, but rather the invention is directed to the generic area as hereinbefore disclosed. Various modifications and embodiments may be made without departing from the spirit and scope thereof.

What is claimed is:

1. A process for chemically bonding a thermosetting resin to a poly-p-xylene substrate comprising:
   (a) providing a cold plasma within a confined region evacuated to a pressure lower than about 100 torr.
   (b) exposing at least one surface of said substrate directly to said plasma within said region for a time period sufficient to form, at the surface of the substrate, functional groups containing oxygen and active hydrogen atoms;

(c) depositing an uncured liquid thermosetting resin capable of reacting with said active hydrogen atoms on said surface; and (d) curing said resin on said substrate for a time period sufficient to set the resin and chemically bond said surface to the resin in situ via said functional groups.

2. A process as defined in claim 1 wherein said thermosetting resin is selected from the group consisting of methyl silicone resin having a combined organo to Si ratio of 0.5 to 1.8, methyl phenyl silicone resin having a combined organo to Si ratio of 0.5 to 1.8, alkyd resin, phenolic resin, melamine formaldehyde resin, urea formaldehyde resin, bisphenol-A-formaldehyde resin, epoxy resin and polyurethane resin.

3. A process as defined in claim 1 wherein said thermosetting resin is polyurethane resin.

4. A process as defined in claim 1 wherein said substrate is poly (monochloro)-p-xylylene.

5. A process as defined in claim 1 wherein said plasma is formed in argon.

6. A process as defined in claim 1 wherein said plasma is formed in helium.

7. A process as defined in claim 1 wherein said plasma is formed in oxygen.

8. A process as defined in claim 1 wherein said plasma is formed in a gas selected from the group consisting of an oxygen-containing gas and an inert gas.

9. A process as defined in claim 1 wherein said pressure in said confined region is between about 1 and about 4 torr.

10. A process as defined in claim 9 wherein said pressure is between about 1 and about 3 torr.

11. A process as defined in claim 1 wherein said functional groups are chemically bonded to the surface of said substrate in an amount sufficient to increase its surface energy by at least about 10 dynes/cm.

12. A process as defined in claim 1 wherein said functional groups are chemically bonded to the surface of said substrate in an amount sufficient to increase its surface energy to between about 55 dynes/cm and about 90 dynes/cm.

13. A process as defined in claim 1 wherein said thermosetting resin is deposited over said surface not more than about 24 hours after said surface has been exposed to said plasma.

14. A process as defined in claim 1 wherein said thermosetting resin is deposited over said surface at least 24 hours after said surface has been exposed to said plasma.

15. A process as defined in claim 1 wherein said functional groups are hydroxyl or carboxyl groups.

16. A process as defined in claim 1 wherein said thermosetting resin is cured by heating at a temperature at which said thermosetting resin cures into a solid thermoset resin.

17. A process as defined in claim 1 wherein said thermosetting resin is cured by exposure to ultraviolet light.

18. A process for making a composite article comprising:

(a) coating a substrate with a poly-p-xylylene film, said substrate selected from the group consisting of plastics, metals, ceramics and combinations thereof;

(b) exposing at least one surface of said coating directly to a cold plasma within a confined region evacuated to a pressure lower than about 100 torr for a period of time sufficient to form, at the surface of the coating, functional groups containing oxygen and active hydrogen atoms;

(c) depositing an uncured liquid thermosetting resin capable of reacting with said active hydrogen atoms on said surface; and (d) curing said resin on said substrate for a time period sufficient to set the resin and chemically bond said surface to the resin in situ via said functional groups.

19. In a method of repairing a poly-p-xylyene coated substrate wherein the poly-p-xylylene coating has been removed from a portion of the substrate, the improvement comprising:

(a) exposing the poly-p-xylylene coating which borders the said substrate portion to a cold plasma within a region evacuated to a pressure lower than about 100 torr for a period of time sufficient to form, at the surface of said bordering poly-p-xylylene coating, functional groups containing oxygen and active hydrogen atoms;

(b) depositing an uncured liquid thermosetting resin, capable of reacting with said active hydrogen atoms, on the coating surface and the surface of the substrate portion; and (c) curing said resin for a time period sufficient to set the resin and chemically bond the coating surface to the resin in situ via the functional groups thus covering the surface of the substrate portion from which the poly-p-xylylene coating was removed.

* * * * *